(12) United States Patent
Huang et al.

(10) Patent No.: US 11,602,054 B2
(45) Date of Patent: Mar. 7, 2023

(54) CIRCUIT BOARD AND METHOD FOR MANUFACTURING THE SAME

(71) Applicant: SHENNAN CIRCUITS CO., LTD., Shenzhen (CN)

(72) Inventors: Lixiang Huang, Shenzhen (CN); Zedong Wang, Shenzhen (CN); Hua Miao, Shenzhen (CN)

(73) Assignee: SHENNAN CIRCUITS CO., LTD., Shenzhen (CN)

( * ) Notice: Subject to any disclaimer, the term of this patent is extended or adjusted under 35 U.S.C. 154(b) by 0 days.

(21) Appl. No.: 17/138,786

(22) Filed: Dec. 30, 2020

(65) Prior Publication Data

US 2022/0015241 A1    Jan. 13, 2022

Related U.S. Application Data

(63) Continuation of application No. PCT/CN2020/127013, filed on Nov. 6, 2020.

(30) Foreign Application Priority Data

Jul. 7, 2020 (CN) .......................... 202010645387.1

(51) Int. Cl.
| | |
|---|---|
| *H05K 1/18* | (2006.01) |
| *H05K 3/30* | (2006.01) |
| *H05K 3/10* | (2006.01) |
| *H05K 1/02* | (2006.01) |

(52) U.S. Cl.
CPC ............ *H05K 3/107* (2013.01); *H05K 1/023* (2013.01); *H05K 1/0231* (2013.01); *H05K 1/0233* (2013.01); *H05K 1/0234* (2013.01); *H05K 1/185* (2013.01); *H05K 3/30* (2013.01); *H05K 2201/09036* (2013.01)

(58) Field of Classification Search
CPC .......... H05K 1/183; H05K 3/30; H05K 3/301; H05K 1/185
See application file for complete search history.

(56) References Cited

U.S. PATENT DOCUMENTS

| | | | |
|---|---|---|---|
| 10,504,848 B1 * | 12/2019 | Parto ................... | H01L 23/5383 |
| 2001/0042640 A1 * | 11/2001 | Nakamura .............. | H01L 23/13 |
| | | | 174/262 |
| 2006/0118931 A1 | 6/2006 | Ho et al. | |
| 2016/0007469 A1 | 1/2016 | Fu et al. | |
| 2016/0150650 A1 | 5/2016 | Cho | |

FOREIGN PATENT DOCUMENTS

| | | |
|---|---|---|
| CN | 1391432 A | 1/2003 |
| CN | 1953151 A | 4/2007 |
| CN | 103906372 A | 7/2014 |
| CN | 104051405 A | 9/2014 |
| CN | 104853522 A | 8/2015 |

OTHER PUBLICATIONS

International Search Report, international application No. PCT/CN2020/127013, dated Apr. 16, 2021 (15 pages).

* cited by examiner

*Primary Examiner* — Jeremy C Norris

(57) ABSTRACT

The present disclosure provides a circuit board and a method for manufacturing the circuit board. The circuit board may include: a base board, an embedded component, and an attached component. The base board may define a groove, the embedded component can be disposed in the groove. The attached component can be attached to at least one surface of the base board and connected to the embedded component.

18 Claims, 3 Drawing Sheets

CIRCUIT BOARD AND METHOD FOR MANUFACTURING THE SAME

CROSS-REFERENCE TO RELATED APPLICATIONS

The present application is a continuation application of International (PCT) Patent Application No. PCT/CN2020/127013 filed Nov. 6, 2020, which claims foreign priority of Chinese Patent Application No. 202010645387.1, filed on Jul. 7, 2020, the entire contents of which are hereby incorporated by reference in their entireties.

TECHNICAL FIELD

The present disclosure relates to the field of circuit boards embedding, and in particular to a circuit board and a method for manufacturing a circuit board.

BACKGROUND

With the rapid development of the electronics industry, devices such as capacitors need to be placed into the PCB. Currently, the integration degree of the PCB embedded in the devices is low, the process of embedding is complicated, and the manufacturing cost is high, which make it difficult to meet the requirements of development of the modern process.

SUMMARY OF THE DISCLOSURE

The present disclosure may provide a circuit board and a method for manufacturing a circuit board, enabling the circuit board to have a small volume and high integration.

According to an aspect of the present disclosure, a circuit board is provided and may include a base board, an embedded component and an attached component. The base board may define a groove. The embedded component may be arranged in the groove. The attached component can be disposed on at least one surface of the circuit board and electrically connected with the embedded component.

According to another aspect of the present disclosure, a method for manufacturing an circuit board. The method may include: providing a circuit board; defining a groove in the circuit board; disposing an embedded component in the groove; performing a pressure-bonding treatment to fix the embedded component to the circuit board; attaching an attached component to a surface of the circuit board.

BRIEF DESCRIPTION OF THE DRAWINGS

In order to illustrate technical solutions of embodiments of the present disclosure clearly, accompanying drawings for describing the embodiments will be introduced in brief. Obviously, the drawings in the following description are only some embodiments of the present application. For those skilled in the art, other drawings can be acquired based on the provided drawings without any creative work.

DETAILED DESCRIPTION

Technical solutions of the embodiments of the present disclosure may be clearly and comprehensively described by referring to accompanying figures of the embodiments. Obviously, embodiments to be described are only a part of, but not all of, the embodiments of the present disclosure. Any ordinary skilled person in the art may obtain other embodiments based on the embodiments of the present disclosure without any creative work, and the other embodiments should be included in the scope of the present disclosure.

The present disclosure may provide a circuit board embedded with an inductor, a capacitor, a resistor and a functional module to realize a small size of the circuit board. In detail, a groove may be defined in the circuit board, an embedded component may be placed into the groove of the circuit board, and then an attached component can be arranged on at least one surface of the circuit board, and the attached component can be coupled to the embedded component as required.

Figure 1:
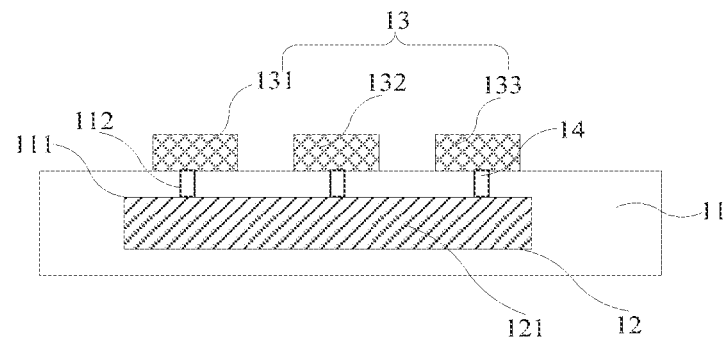
FIG. 1 is a structural schematic view of a circuit board according to a first embodiment of the present disclosure.

As shown in FIG. 1, which is a structural schematic view of a circuit board according to a first embodiment of the present disclosure, the circuit board may include a base board 11 with a groove 111. An embedded component 12 may be embedded in the groove 111. In this embodiment, the embedded component 12 may include an inductance module 121, in other words, the inductance module 121 can be arranged in the groove 111. An attached component 13 may include a functional module 131, a capacitance module 132 and a resistance module 133 coupled to each other, which can be attached to a surface of the base board 11, respectively.

In an embodiment, the groove 111 for placing the embedded component 12 may be a through groove penetrating the base board 11 or a blind groove without penetrating the base board 11. In this embodiment, the groove 111 may be a blind groove that does not penetrate the base board 11. In an embodiment, the blind groove 111 may be a blind groove that penetrates only one surface of the base board 11. When the embedded component 12 is placed in the groove 111, a surface of the embedded component 12 may be exposed from the surface of the base board 11. In another embodiment, if the groove 111 is a through groove penetrating the base board 11, both surfaces of the embedded component 12 can be exposed from the surface of the base board 11 when the embedded component 12 is placed in the groove 111.

In one embodiment, in a process of disposing the embedded component 12 into the groove 111, it is necessary to add adhesive in the groove 111, i.e., around the embedded component 12, to adhere the embedded component 12 to the base board 11. In this embodiment, the adhesive can be resin or molding silica gel.

In an embodiment, a transmitting current of the inductance module 121 may be greater than or equal to 5 A.

In this embodiment, a plurality of conductive terminals 14 may be arranged on at least one surface of the embedded component 12. A plurality of blind holes 112 may be defined in the base board 11 at positions each corresponding to a conductive terminal 14. The conductive terminals 14 may be electrically connected to the attached component 13 disposed on the surface of the base board 11 along the blind holes 112. Alternatively, the plurality of conductive terminals 14 may be connected to a circuit pattern layer on the surface of the base board 11 along the blind holes 112. The attached component 13 can be attached to the surface of the base board 11 and connected to the circuit pattern layer, thereby electrically connecting the inductance module 121 with the functional module 131, the capacitance module 132 and the resistance module 133.

In an embodiment, the base board 11 can be made by stacking a plurality of core boards and bonding them by adhesive, and providing a circuit pattern layer on the surface of the plurality of core boards. In detail, the core board may be a copper clad laminate, and the adhesive can be a prepreg. The copper clad laminate may be a basic material for making a base board 11, and include a substrate and a copper foil covering the substrate. The substrate can be made by combining a plurality of adhesive sheets made of paper substrate, glass fiber cloth substrate, synthetic fiber cloth substrate, non-woven substrate, composite substrate and other materials impregnated with resin. Copper foil may be coated on one side or both sides of the substrate, and then a hot-press curing can be performed to make a copper-clad board. As the interbedded bonding layer during a lamination, the prepreg can be mainly composed of resin and reinforcing material. In the production of the multilayer base board 11, glass fiber cloth can be usually used as the reinforcing material. The glass fiber cloth can be impregnated with resin glue, and then heat-treated and pre-baked into a thin sheet. The prepreg will soften while being heated and pressurized, and will cure under a cooling. The prepreg can be sticky and can bond two adjacent layers together during high-temperature pressing.

In one embodiment, the inductance module 121, the functional module 131, the capacitance module 132 and the resistance module 133 may be coupled to each other.

In this embodiment, the inductance module 121 may be embedded in the base board 11, and the functional module 131, the capacitance module 132 and the resistance module 133 can be arranged on the surface of the base board 11. A vertical projection of the functional module 131, the capacitance module 132 and the resistance module 133 on the base board 11 and a vertical projection of the inductance module 121 on the base board 11 may be overlapped. Compared with the case where the inductance module 121, the functional module 131, the capacitance module 132 and the resistance module 133 are all attached to the surface of the base board 11, an area of the base board 11 can be reduced.

In another embodiment, the embedded component 12 can also be a power chip; the attached component 13 can also be a functional module, an inductance module and a resistance module that are coupled to each other. That is, element 131 shown in the FIG. 1 can be the inductance module, element 132 can be the functional module, and element 133 can be the resistance module. In an embodiment, the attached component 13 may also include a capacitance module, etc., which can be set according to requirements, and it is not limited. Of course, there can be multiple power chips in the embedded component 12, which can be stacked in the groove 111, and can also be arranged side by side in the groove 111, which is not limited here.

Figure 2:
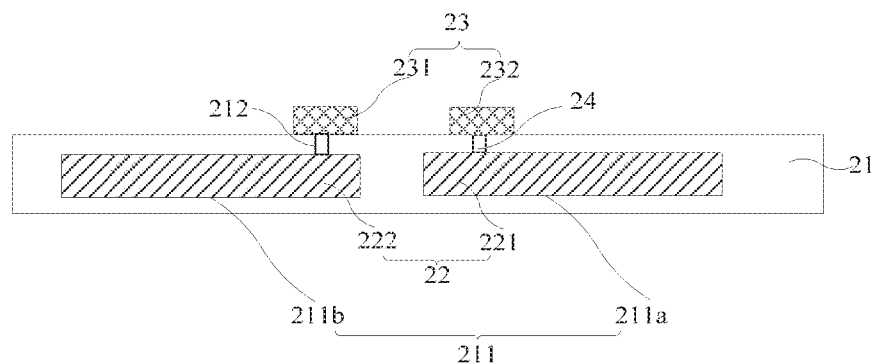
FIG. 2 is a structural schematic view of a circuit board according to a second embodiment of the present disclosure.

FIG. 2 is a structural schematic view of a circuit board according to a second embodiment of the present disclosure. Compared to the first embodiment shown in FIG. 1, the difference of the second embodiment in FIG. 2 is that: the groove 211 in this embodiment may include a first groove 211a and a second groove 211b, and the first groove 211a and the second groove 211b can be defined side by side in the base board 21. The attached component 23 in this embodiment can include a capacitance module 231 and a resistance module 232 coupled to each other. The embedded component 22 may include an inductance module 221 and a functional module 222 coupled with each other. The inductance module 221 can be arranged in the first groove 211a, and the functional module 222 can be arranged in the second groove 211b. In an embodiment, the inductance module 221 may be arranged on a left side or on a right side.

In this embodiment, a plurality of conductive terminals 24 may be arranged on one surface of the embedded component 22 (the inductance module 221 and the functional module 222). A plurality of blind holes 212 may be defined in the base board 21 at positions each corresponding to a conductive terminal 24. The conductive terminals 24 may be electrically connected to the attached components 23 (the capacitance module 231 and the resistance module 232) disposed on the surface of the base board 21 along the blind holes 212. Alternatively, the conductive terminals 24 may be connected to a circuit pattern layer on the surface of the base board 21 along the blind holes 212. The attached component 23 (the capacitance module 231 and the resistance module 232) can be connected to the circuit pattern layer on the surface of the base board 21, and then the embedded component 22 (inductance module 221 and functional module 222) and the attached component 23 (the capacitance module 231 and resistance module 232) can be electrically connected through the circuit pattern layer.

Figure 3:
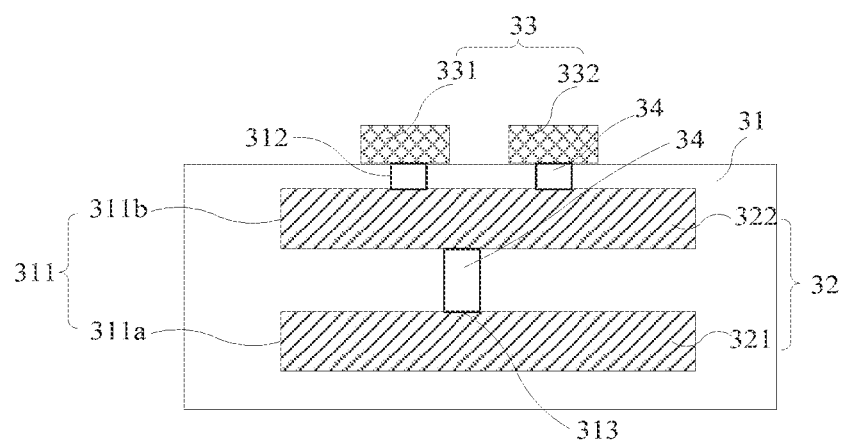
FIG. 3 is a structural schematic view of a circuit board according to a third embodiment of the present disclosure.

FIG. 3 is a structural schematic view of a circuit board according to a third embodiment of the present disclosure. Compared to the first embodiment shown in FIG. 2, the difference of the third embodiment in FIG. 3 is that: the groove 311 may include a first groove 311a and a second groove 311b, and the first groove 311a and the second groove 311b can be defined in the base board 31 of a vertical arrangement. The attached component 33 in this embodiment may include a capacitance module 331 and a resistance module 332 coupled to each other. The embedded component 32 may include an inductance module 321 and a functional module 322 coupled to each other. The inductance module 321 may be arranged in the first groove 311a, and the functional module 322 can be arranged in the second groove 311b.

In the present embodiment, the functional module 322 can be disposed in an upper groove 311b in the base board 31, and the inductance module 321 can be disposed in a lower groove 311a in the base board 31. In another embodiment, the functional module 322 may also be disposed in a lower groove 311a in the base board 31, and the inductance module 321 may also be disposed in an upper groove 311b in the base board 31, it is not limited.

In this embodiment, a plurality of conductive terminals 34 may be arranged on one surface of the embedded component 32 (the inductance module 321 and the functional module 222). A plurality of blind holes 312 may be defined in the base board 31 at positions each corresponding to a conductive terminal 34. In the present embodiment, another blind hole 313 can also be defined in the base board 31 between the first groove 311a and the second groove 311b. The inductance module 321 can be connected to the functional module 322 through a conductive terminal along the another blind hole 313. The conductive terminals 34 of the functional module 322 can be electrically connected to the attached component 33 (the capacitance module 331 and the resistance module 332) located on the surface of the base board 31 along the blind holes 312. Alternatively, the conductive terminals 34 may be connected to the circuit pattern layer on the surface of the base board 31 along the blind holes 312. The attached component 33 (the capacitance module 331 and the resistance module 332) can be connected to the circuit pattern layer on the surface of the base board 31, and then the embedded component 32 (the inductance module 321 and the functional module 322) and the attached component 33 (the capacitance module 331 and resistance module 332) can be electrically connected through the circuit pattern layer.

Figure 4:
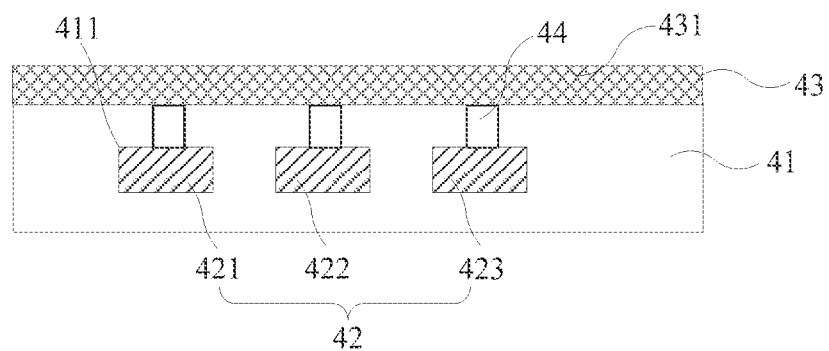
FIG. 4 is a structural schematic view of a circuit board according to a fourth embodiment of the present disclosure.

As shown in FIG. 4, which is a schematic structural diagram of the fourth embodiment of the circuit board, in this embodiment, the embedded component 42 may include a functional module 421, a capacitance module 422, and a resistance module 423 coupled to each other. The attached component 43 can include an inductance module 431. The functional module 421, the capacitance module 422 and the resistance module 423 can be arranged in a corresponding groove 411, and the inductance module 431 may be attached to the surface of the base board 41.

Since the volume of the inductance module 431 is usually large, in one embodiment, in order to reduce the area of the base board 41, a vertical projection of the inductance module 431 on a plane vertical to a thickness direction of the base board 41 completely coincides with a projection of the base board 41, so that the area of the base board 41 can be smaller.

In the present embodiment, a plurality of conductive terminals 44 may be arranged on one surface of the embedded component 42 (the functional module 421, the capacitance module 422 and the resistance module 423). The functional module 421, the capacitance module 422 and the resistance module 423 may be connected to the inductance module 431 by the conductive terminals 44.

Figure 5:
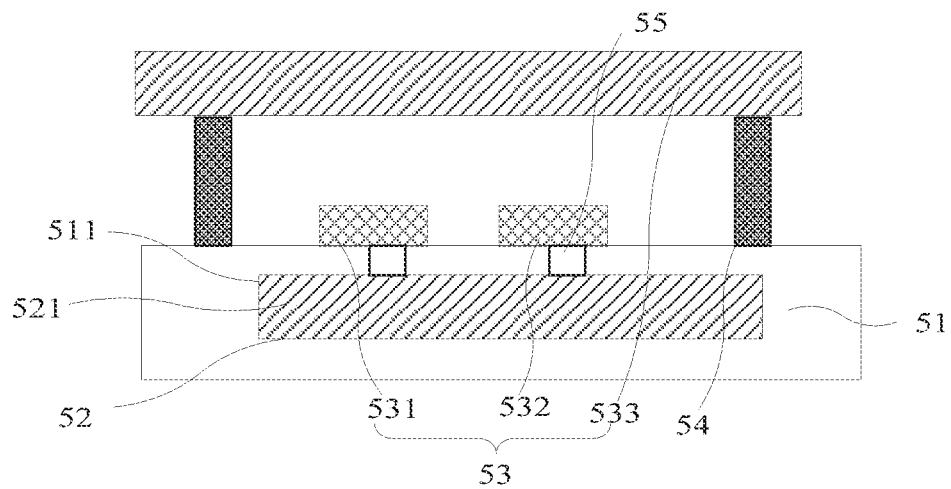
FIG. 5 is a structural schematic view of a circuit board according to a fifth embodiment of the present disclosure.

Referring to FIG. 5, which is a schematic structural diagram of the fifth embodiment of the circuit board, in this embodiment, the embedded component 52 may include an inductance module 521, and the attached component 53 may include a functional module 533, a capacitance module 531 and a resistance module 532 coupled to each other.

The inductance module 521 may be arranged in a groove 511 of the base board 51. The capacitance module 531 and the resistance module 532 can be attached to a surface of the base board 51. A plurality of connecting posts 54 may be arranged on a surface of the base board 51 close to the attached component 53, and the functional module 533 of the attached component 53 may be arranged on the connecting posts 54. In an embodiment, a height of each connecting post 54 may be greater than or equal to a height of the capacitance module 531 and the resistance module 532 of the attached component 53.

In this embodiment, the functional module 533 may be arranged above the base board 51, and the capacitance module 531 and the resistance module 532 can be arranged between the base board 51 and the functional module 533, so that an area of the base board 51 can be reduced, and a thickness of the overall product can also be reduced to a certain extent.

In the present embodiment, a plurality of conductive terminals 55 can be disposed on a surface of the embedded component 52 (the inductance module 521). The embedded component 52 (the inductance module 521) and the attached component 53 (the capacitance module 531 and the resistance module 532) can be electrically connected with each other through conductive terminals 55. Optionally, the conductive terminals 55 can connect the embedded component 52 (the inductance module 521) to a circuit pattern layer on the surface of the base board 51. In this embodiment, the functional module 533 of the attached component 53 may be connected to the base board 51 through the connecting posts 54. In detail, the connecting posts 54 can be electrically connected to the circuit pattern layer on the surface of the base board 51, thereby electrically connecting the functional module 533 to the embedded component 52 (the inductance module 521).

Figure 6:
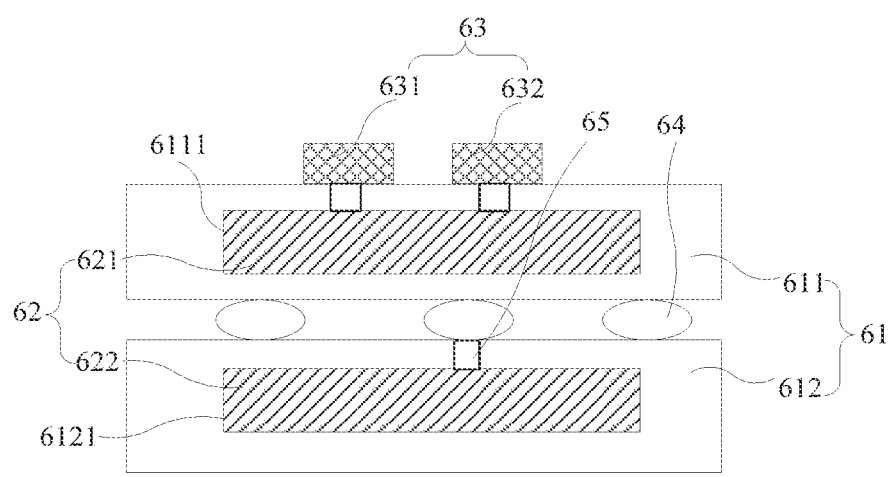
FIG. 6 is a structural schematic view of a circuit board according to a sixth embodiment of the present disclosure.

As shown in FIG. 6, which is a schematic structural diagram of the sixth embodiment of the circuit board, in this embodiment, the base board 61 may include a first base board 611 and a second base board 612. The first base board 611 may define a first groove 6111, the second base board 612 may define a second groove 6121. The first base board 611 and the second base board 612 can be stacked together. A plurality of connecting members 64 may be disposed between the first base board 611 and the second base board 612 to electrically connect the first base board 611 and the second base board 612. In one embodiment, the connecting members 64 can be solder balls.

In this embodiment, the embedded component 62 may include a first embedded component 621 and a second embedded component 622. The first embedded component 621 can be disposed in the first groove 6111, and the second embedded component 622 can be disposed in the second groove 6121. In detail, the first embedded component 621 may be an inductance module 6211, and the second embedded component 622 can be a functional module 6221. In another embodiment, the first embedded component 621 may be a functional module, and the second embedded component 622 may be an inductance module.

The attached element 63 may be disposed on a surface of the first base board 611, and can include a capacitance module 631 and a resistance module 632.

In this embodiment, a plurality of conductive terminals 65 can be arranged on a surface of the second embedded component 622, and may be used to electrically connect the second embedded component 622 with a circuit pattern layer disposed on the surface of the second base board 612, and the first base board 611 can be electrically connected with the second base board 612 via the connecting members 64.

Figure 7:
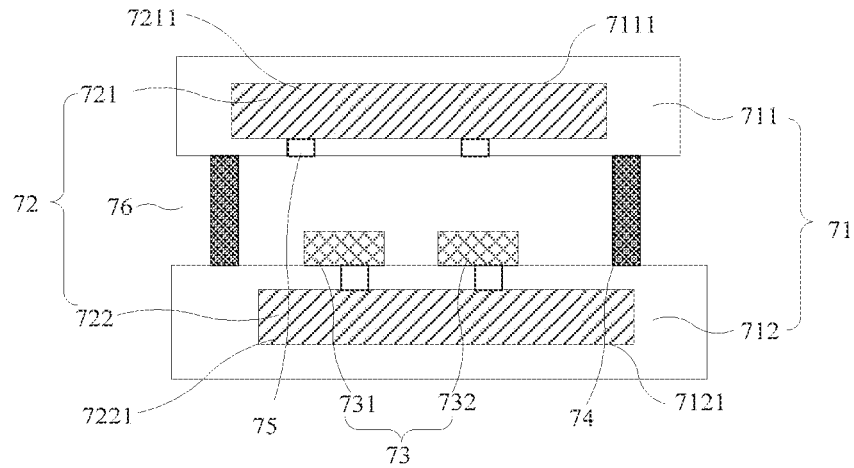
FIG. 7 is a structural schematic view of a circuit board according to a seventh embodiment of the present disclosure.

Please refer to FIG. 7, which is a schematic structural diagram of the seventh embodiment of the circuit board of this disclosure, in this embodiment, the attached component 73 may include a capacitance module 731 and a resistance module 732 coupled to each other. The embedded element 72 may include a first embedded component 721 and a second embedded component 722. The first embedded component 721 can be an inductance module, and the second embedded component 722 can be a functional module. The base board 71 can include a first base board 711 and a second base board 712 stacked together. A gap 76 may be defined between the first base board 711 and the second base board 712. The attached component 73 may be disposed in the gap 76 between the first base board 711 and the second base board 712. In an embodiment, the attached component 73 may be attached to a surface of an upper first base board 711 close to a lower second base board 712, and may also be attached to a surface of the lower second base board 712 close to the upper first base board 711. A plurality of connecting members 74 may be disposed between the first base board 711 and the second base board 712. In an embodiment, the connecting member 74 can be at least one of a copper post and a solder ball.

The first base board 711 may define a first groove 7111, and the second base board 712 defines a second groove 7121. The inductance module 7211 and the functional module 7221 can be respectively arranged in the first groove 7111 and the second groove 7121. In an embodiment, the first base board 711 may be located above the second base board 712, the inductance module 7211 may be disposed in the first groove 7111, and the functional module 7221 may be disposed in the second groove 7121. In another embodiment, the first base board 711 may be located under the second base board 712, the inductance module 7211 may be disposed in the second groove 7121, and the functional module 7221 may be disposed in the first groove 7111.

A height of each connecting member 74 may not be less than a height of the attached component 73. In one embodiment, the height of the connecting members 74 can be greater than the height of the capacitance module 731 and the resistance module 732. In another embodiment, the height of each connecting member 74 may also be equal to the height of the capacitance module 731 and the resistance module 732.

In this embodiment, the inductance module 7211 and the functional module 7221 may be electrically connected to the circuit pattern layer on the surface of the first base board 711 and the circuit pattern layer on the surface of the second base board 712 through conductive terminals 75, and an electrical connection between the inductance module 7211 and the functional module 7221 can be realized further by the connecting members 74. The attached component 73 (the capacitance module 731 and the resistance module 732) can also be connected to the circuit pattern layer through conductive terminals 75.

Figure 8:
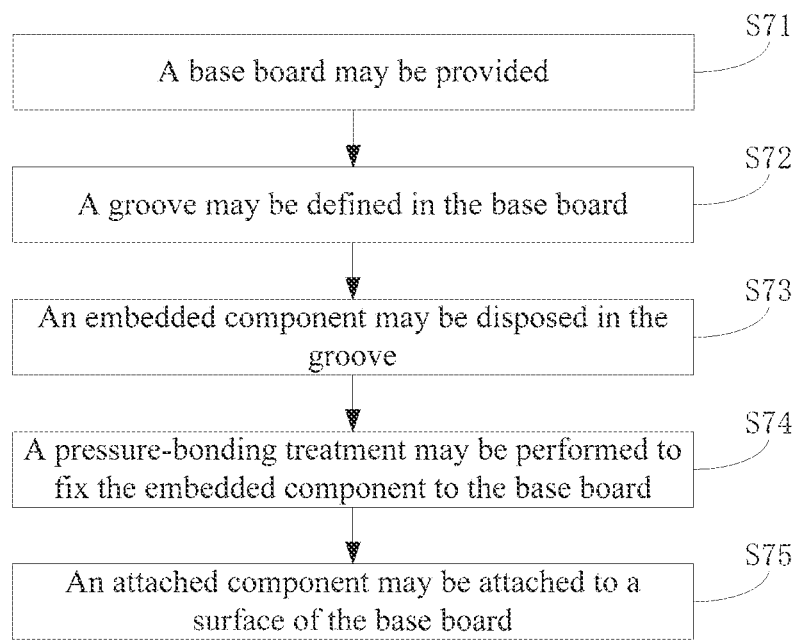
FIG. 8 is a flow chart of a method for manufacturing the circuit board according to an embodiment of the present disclosure.

FIG. 8 is a flow chart of a method for manufacturing the circuit board according to an embodiment of the present disclosure. In this embodiment, the method for manufacturing the circuit board may include following operations.

In an operation S71, a baseboard may be provided.

The base board can be made by stacking a plurality of core boards and bonding them by adhesive, and providing a circuit pattern layer on the surface of the plurality of core boards. In detail, the core board may be a copper clad laminate, and the adhesive can be a prepreg. The copper clad laminate may be a basic material for making a base board, and include a substrate and a copper foil covering the substrate. The substrate can be made by combining a plurality of adhesive sheets made of paper substrate, glass fiber cloth substrate, synthetic fiber cloth substrate, non-woven substrate, composite substrate and other materials impregnated with resin. Copper foil may be coated on one side or both sides of the substrate, and then a hot-press curing can be performed to make a copper-clad board. As the interbedded bonding layer during a lamination, the prepreg can be mainly composed of resin and reinforcing material. In the production of the multilayer base board, glass fiber cloth can be usually used as the reinforcing material. The glass fiber cloth can be impregnated with resin glue, and then heat-treated and pre-baked into a thin sheet. The prepreg will soften while being heated and pressurized, and will cure under a cooling. The prepreg can be sticky and can bond two adjacent layers together during high-temperature pressing.

In detail, a circuit pattern layer can be arranged on a surface of the core board according to requirements.

In an operation S72, a groove may be defined in the base board.

The groove can be defined at a designated position of the base board by controlled deep milling or etching. The circuit pattern layer should be avoided while defining the groove to prevent the circuit from being damaged.

The groove may be a through groove penetrating the base board, or a blind groove without penetrating the base board.

In an operation S73, an embedded component may be disposed in the groove.

The embedded component can be placed in the groove. In order to bond the embedded component and the base board into a whole, adhesive glue is needed to be arranged on surfaces of the embedded component and side walls of the base board at the groove. The adhesive glue may be resin.

In an operation S74, a pressure-bonding treatment may be performed to fix the embedded component to the base board.

After the embedded component is placed in the groove, the base board can be pressure-bonded to fix the embedded component to the base board.

In an operation S75, an attached component may be attached to a surface of the base board.

The attached component can be arranged on at least one surface of the base board. In one embodiment, the attached component can be bonded to the base board through a prepreg, or can be connected to the surface of the base board through a pin.

According to the present disclosure, part of the large-volume devices may be arranged in the base board, and the attached component can be arranged on the surface of the base board, resulting in a reduction of the volume of the base board and the volume of the whole product.

The above only describes implementations of the present disclosure, and does not limit the scope of the present disclosure. Any equivalent structural or equivalent process transformation performed based on the content of the present description and drawings, directly or indirectly applied to other related art, should also be included in the scope of the present disclosure.

What is claimed is:

1. A circuit board, comprising:
   a base board, defining a groove, wherein the base board comprises at least one circuit pattern layer;
   an embedded component, arranged in the groove;
   an attached component, disposed on at least one surface of the base board and electrically connected with the embedded component;
   wherein a plurality of conductive terminals are disposed on at least one surface of the embedded component, a plurality of first blind holes are defined in the base board at positions each of which is corresponding to a conductive terminal, each conductive terminal is connected to the attached component along a corresponding first blind hole, the embedded component is connected with the at least one circuit pattern layer through the conductive terminals;
   the base board comprises a first base board and a second base board stacked together, a plurality of connecting members disposed between the first base board and the second base board and connected with the first base board and the second base board;
   the first base board defines a first groove, a first embedded component is disposed in the first groove;
   the second base board defines a second groove, a second embedded component is disposed in the second groove.

2. The circuit board according to claim 1, wherein the embedded component comprises an inductance module;

the attached component comprises a functional module, a capacitance module and a resistance module coupled with each other;
the inductance module is arranged in the groove, the functional module, the capacitance module and the resistance module are attached on the at least one surface of the base board.

3. The circuit board according to claim 2, wherein a vertical projection of the functional module, the capacitance module and the resistance module on the base board and a vertical projection of the inductance module on the base board are overlapped.

4. The circuit board according to claim 2, wherein
a transmitting current of the inductance module is greater than or equal to 5 A;
the groove is a through groove penetrating two surfaces of the base board; or
the groove is a blind groove penetrating one surface of the base board.

5. The circuit board according to claim 1, wherein
the attached component comprises a capacitance module and a resistance module coupled with each other;
the embedded component comprises an inductance module and a functional module coupled with each other;
the groove comprises a first groove and a second groove, the inductance module is disposed in the first groove and the functional module is disposed in the second groove;
the first groove and the second groove are arranged side by side.

6. The circuit board according to claim 5, wherein
a transmitting current of the inductance module is greater than or equal to 5 A;
the groove is a through groove penetrating two surfaces of the base board; or
the groove is a blind groove penetrating one surface of the base board.

7. The circuit board according to claim 1, wherein
the attached component comprises a capacitance module and a resistance module coupled with each other;
the embedded component comprises an inductance module and a functional module coupled with each other;
the groove comprises a first groove and a second groove, the inductance module is disposed in the first groove and the functional module is disposed in the second groove;
the first groove and the second groove are arranged in a stack.

8. The circuit board according to claim 7, wherein
a second blind hole is defined in the base board between the first groove and the second groove, the inductance module is connected to the functional module through a conductive terminal disposed the second blind hole.

9. The circuit board according to claim 7, wherein
a transmitting current of the inductance module is greater than or equal to 5 A;
the groove is a through groove penetrating two surfaces of the base board; or
the groove is a blind groove penetrating one surface of the base board.

10. The circuit board according to claim 1, wherein
the embedded component comprises a functional module, a capacitance module and a resistance module coupled with each other;
the attached component comprises an inductance module;
a vertical projection of the inductance module on a plane vertical to a thickness direction of the base board coincides with a vertical projection of the base board on the plane.

11. The circuit board according to claim 10, wherein
a transmitting current of the inductance module is greater than or equal to 5 A;
the groove is a through groove penetrating two surfaces of the base board; or
the groove is a blind groove penetrating one surface of the base board.

12. The circuit board according to claim 1, wherein
the embedded component comprises an inductance module;
the attached component comprises a functional module, a capacitance module, a resistance module coupled with each other;
the inductance module is arranged in the groove, the capacitance module and the resistance module are attached on the at least one surface of the base board;
a plurality of connecting posts are arranged on a surface of the base board close to the capacitance module and the resistance module, the functional module is arranged on the plurality of connecting posts;
a height of each connecting post is greater than or equal to a height of the capacitance module and the resistance module.

13. The circuit board according to claim 12, wherein
a transmitting current of the inductance module is greater than or equal to 5 A;
the groove is a through groove penetrating two surfaces of the base board; or
the groove is a blind groove penetrating one surface of the base board.

14. The circuit board according to claim 1, wherein
the attached component is arranged on a surface of the first base board away from the second base board; or
the attached component is arranged between the first base board and the second base board, a height of the connecting member is greater than or equal to a height of the attached component.

15. The circuit board according to claim 14, wherein
the first embedded component is an inductance module, the second embedded component is a functional module, the attached component is the capacitance module and the resistance module coupled with each other.

16. The circuit board according to claim 1, wherein the embedded component comprises a power chip.

17. A method for manufacturing a circuit board, comprising:
providing a base board;
defining a groove in the base board;
disposing an embedded component in the groove;
performing a pressure-bonding treatment to fix the embedded component to the base board;
attaching an attached component to a surface of the base board;
wherein a plurality of conductive terminals are disposed on at least one surface of the embedded component, a plurality of first blind holes are defined in the base board at positions each of which is corresponding to a conductive terminal, each conductive terminal is connected to the attached component along a corresponding first blind hole;
the base board comprises a first base board and a second base board stacked together, a plurality of connecting members disposed between the first base board and the second base board and connected with the first base board and the second base board;

the first base board defines a first groove, a first embedded component is disposed in the first groove;

the second base board defines a second groove, a second embedded component is disposed in the second groove.

18. A circuit board, comprising:

a base board, defining a groove;

an embedded component, arranged in the groove;

an attached component, disposed on at least one surface of the base board and electrically connected with the embedded component;

wherein a plurality of conductive terminals are disposed on at least one surface of the embedded component, a plurality of first blind holes are defined in the base board at positions each of which is corresponding to a conductive terminal, each conductive terminal is connected to the attached component along a corresponding first blind hole;

the base board comprises a first base board and a second base board stacked together, a plurality of connecting members disposed between the first base board and the second base board and connected with the first base board and the second base board;

the first base board defines a first groove, a first embedded component is disposed in the first groove;

the second base board defines a second groove, a second embedded component is disposed in the second groove.

* * * * *